United States Patent [19]

Pascente

[11] 3,812,382

[45] May 21, 1974

[54] SYNCHRONOUS SWITCHING CIRCUIT

[75] Inventor: Joseph E. Pascente, Norridge, Ill.

[73] Assignee: Grigsby-Barton, Inc., Rolling Meadows, Ill.

[22] Filed: Aug. 25, 1972

[21] Appl. No.: 283,708

Related U.S. Application Data

[63] Continuation-in-part of Ser. No. 231,752, March 3, 1972, which is a continuation-in-part of Ser. No. 76,132, Sept. 28, 1970, Pat. No. 3,668,422.

[52] U.S. Cl. .......................... 307/133, 307/252 UA
[51] Int. Cl. .......................... H01h 9/56
[58] Field of Search.... 307/133, 252 UA; 317/11 A; 219/115; 323/24

[56] References Cited

UNITED STATES PATENTS

| | | | |
|---|---|---|---|
| 3,648,075 | 3/1972 | Mankovitz | 307/252 UA |
| 3,328,606 | 6/1967 | Pinckaers | 307/252 UA |
| 3,428,865 | 2/1969 | Opad | 317/46 X |
| 3,392,284 | 7/1968 | Cain | 323/21 X |
| 3,715,605 | 2/1973 | Naber | 307/252 UA X |
| 3,705,990 | 12/1972 | Pileckis | 307/252 UA X |

OTHER PUBLICATIONS

Korayne, "Power Supply Switch," IBM Technical Disclosure Bulletin, Vol. 10, No. 8, pp. 1138–1139, Jan. 1968.

*Primary Examiner*—Herman J. Hohauser
*Assistant Examiner*—William J. Smith
*Attorney, Agent, or Firm*—Fitch, Even, Tabin & Luedeka

[57] ABSTRACT

A switching circuit for controlling the application of an a.c. source to a load employs a detector for selectively triggering a control thyristor at a zero-voltage crossing of the source and means for latching the control thyristor during succeeding cycles of the a.c. source. The control thyristor is employed to latch a switching thyristor which, in turn, applies the power from the a.c. source to the load.

11 Claims, 1 Drawing Figure

PATENTED MAY 21 1974 3,812,382
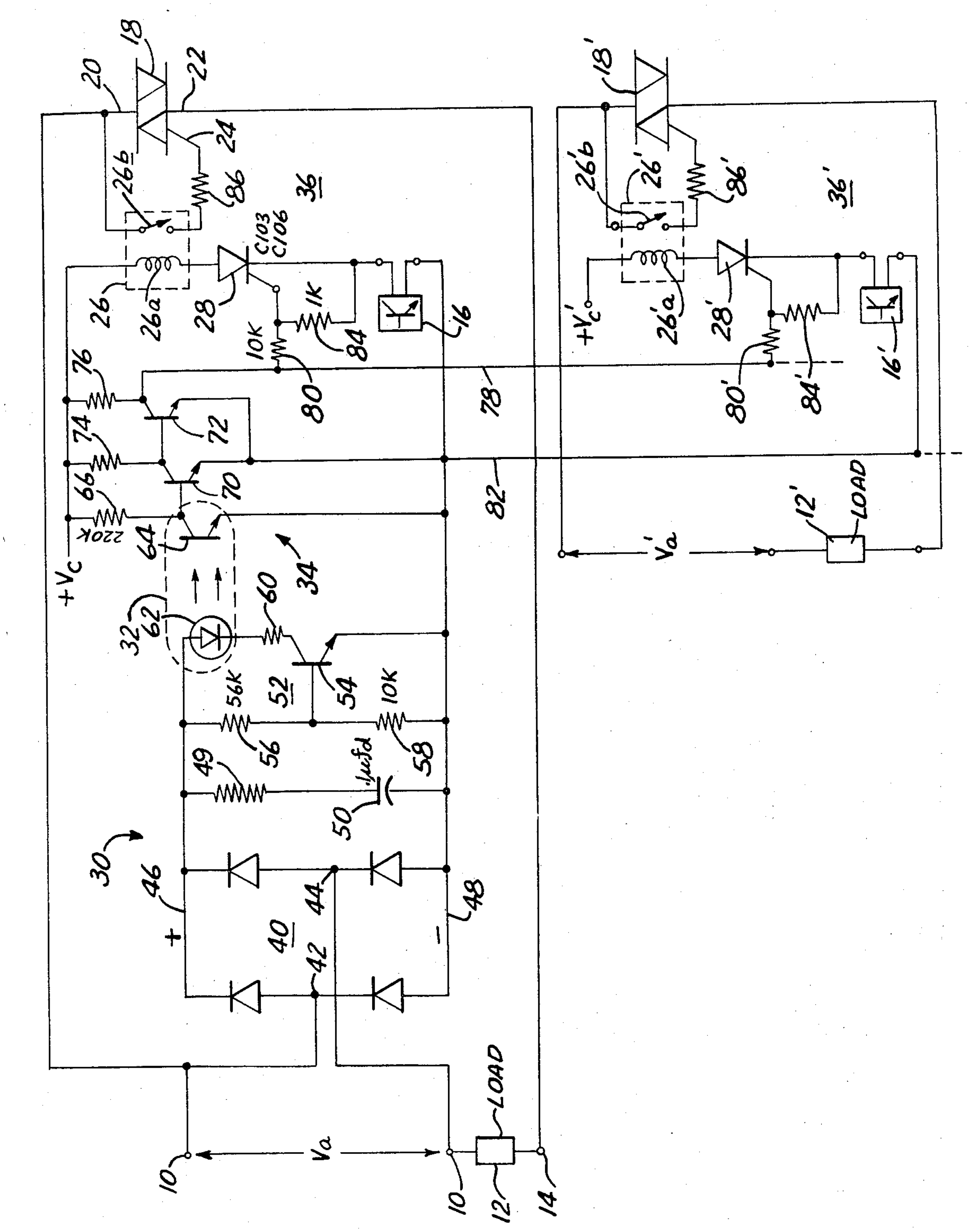

SYNCHRONOUS SWITCHING CIRCUIT

The present invention relates to zero-voltage a.c. switching circuits, and particularly to such circuits employing a triac or other thyristor element or elements arranged for bidirectional operation. The present application is a continuation-in-part of Ser. No. 231,752, filed Mar. 3, 1972, which is a continuation-in-part of Ser. No. 76,132, filed Sept. 28, 1970, and now U.S. Pat. No. 3,668,422.

So-called zero-voltage or synchronous switching circuits generally employing thyristor elements for applying power to a load at a zero-voltage point, and for removing power from the load at a zero current point, are now well known. However, many such circuits as have been heretofore proposed have presented various and special problems when used with certain types of loads. In particular, these circuits have generally presented problems in switching highly reactive loads, as well as in switching resistive or reactive loads which draw either extremely high current or extremely low current relative to the normal ratings of economically practicable and available thyristors.

Various problems associated with the switching of reactive loads are discussed at some length in a number of available publications, such as the General Electric SCR Manual, 4th Edition, 1967, and later editions. The problems associated with the switching of extremely high current loads arise because thyristors, such as triacs, which have high load terminal current ratings also generally require high gate currents for firing, and such gate currents have usually been obtained only by providing additional amplification stages in the zero-voltage switching circuit, adding to the cost and complexity of the circuit. On the other hand, in the switching of relatively low load currents, a problem may also arise in that the thyristor tends to become nonconductive, i.e., to turn off, when the load current is almost equal to the latching current rating of the thyristor, and thus at such low load currents the thyristor may not retain its conductive state, as desired.

Further, in many applications, for example, the triac of an a.c. zero-voltage switching circuit is required to turn on a load that initially draws a relatively low current, but which load may later increase to a high current. Since, typically, the higher the average load current rating of a thyristor, the higher will be the latch current, such a load would normally present serious problems in achieving zero-voltage switching with many of such heretofore existing circuits.

Improved zero-voltage switching circuits which may be utilized to switch either relatively high or low current loads, or loads which draw varying currents from one extreme to the other, are disclosed in the previously identified patent applications. Those circuits generally employ a zero-voltage crossing detector for selectively triggering a control thyristor at a zero-voltage crossing of the source and means for supplying a continuous latch current to the gate of the control thyristor during succeeding cycles of the a.c. source. The control thyristor then latches a switching thyristor which, in turn, applies the power from the a.c. source to the load. Such circuits may be considered to provide so-called "hard fire" of the triac, which minimizes the susceptability of the circuit to the aforementioned problems. It is an object of the present invention to provide such an improved zero-voltage switching circuit of the above type which may also be utilized to switch either high or low current loads, or loads which draw varying currents from one extreme to the other, and, additionally, which assures that the maximum *dv/dt* rating of the triac will be maintained during circuit operation, thereby minimizing commutation problems typically associated with highly reactive loads.

It is a further object of the present invention to provide such an improved zero-voltage switching circuit which is compatible with, and which may be controlled by, relatively low d.c. voltages typically associated with digital logic circuits normally employing transistor or integrated circuit devices or other semi-conductor elements.

It is another object of the present invention to provide a system having a plurality of such improved zero-voltage switching circuits wherein all of them are concurrently driven by a common zero-voltage crossing detector, but are each individually controllable, such as by separate low voltage circuits of, for example, the type typically employed with semi-conductor devices.

These and other objects and advantages of the present invention are more particularly set forth in the following detailed description, and in the accompanying drawing which is a schematic diagram of a zero-voltage switching circuit in accordance with a preferred embodiment of the present invention.

Generally, referring to the drawing, there is shown a switching circuit for controlling the application of an a.c. voltage source $V_a$ from line terminals 10 to a load impedance 12, connected across one of the line terminals and load terminal 14, in response to a command control signal determined by a low voltage transistor, integrated circuit device, or other semiconductor element circuit 16 for actuation and de-actuation of the switching circuit. Switching thyristor means, illustrated as triac 18, having a pair of load terminals, shown as anode 20 and cathode 22 (by analogy to SCR convention), and a control gate terminal 24, has its load terminals 20 and 22 connected in series with the a.c. source (at line terminals 10) and the load 12 (at terminal 14). The triac 18 is switchable from a normally nonconductive or "off" state to a conductive or "on" state by an appropriate firing signal applied between the thyristor gate terminal 24 and one of its load terminals, such as anode 20, with proper potential applied across both load terminals. To remain in the conductive state without further firing or gate input, such thyristors must generally have a current flowing between their load terminals whicn is at least as great, and preferably greater than the rated latch current of the thyristor. Otherwise, the thyrister will be "starved off" and will return to its normally nonconductive state. Thus, to maintain the thyristor conductive through each half-cycle of voltage, the control or gate terminal 24 is conductively coupled in a positive or "hard fire" manner to the anode terminal 20 by means of an actuable switching means 26, preferably a reed relay, in response to a control thyristor means, illustrated as silicon controlled rectifier (SCR) 28, which is also maintained conductive in a manner to be described hereinafter.

Dedector means, generally designated as 30, is responsive to the a.c. source voltage $V_a$ for providing a signal output indicative of zero-voltage crossings of the a.c. source voltage, the signal output being transmitted through a circuit isolating means 32, illustrated as an opto-electronic relay, to an amplifying circuit 34 coupled to the control terminal or gate of SCR 28. The amplifier circuit 34 is energized by a relatively low d.c. voltage $V_c$, which is at a value typically employed with semi-conductor digital logic circuitry (e.g., 48 volts or less), and which also supplies current to the load circuit of the SCR 28 through the series connected pair of control terminals of the electromagnetic reed relay coil 26*a* when the SCR is conductive, the SCR load circuit including the relay coil 26*a* in its anode circuit and the semi-conductor control circuit 16 in its cathode circuit.

Consequently, the amplifier circuit 34 is responsive to the signal output from the zero-voltage crossing detector means 30 for supplying triggering signal pulses to the SCR 28 at each zero-voltage crossing and continuously latching the SCR in its conductive state during succeeding cycles of the a.c. source once the SCR becomes conductive. And the actuable switching means 26 is responsive to the SCR 28 for selectively coupling, and uncoupling, the control terminal 24 of the switching thyristor 18 to, and from, one of the load terminals thereof, viz., anode 20, through the controlled relay contacts 26*b*, in accordance with the state of the SCR 28.

The control and switching thyristor circuits which are driven by the amplifier 34 form a power switching circuit, generally designated as 36. Thus, as shown, the amplifier circuit 34 may also drive additional power switching circuits, such as that generally designated as 36', which are constructed in a manner similar to that described above, having a triac 18', and an SCR 28' actuating a reed relay 26' for latching the triac 18' in response to trigger signals and latching current supplied from the amplifier circuit 34 and low d.c. voltage $V_c$, as controlled by a separate semi-conductor circuit 16'. This additional switching circuit 36' is thus separately controlled but commonly driven with the principal power switching circuit 36 to selectively apply the line voltage $V'_a$ (which may of course be the same line voltage as $V_a$) to another load 12' connected in series with the line and load terminals of triac 18'. Of course, a relatively large system may be constructed in accordance with these principles having any number of power switching circuits which are each separately controlled, but commonly driven by a single detector 30 with suitable amplifying circuit means 34.

More particularly, the detector means 30 of the illustrated embodiment comprises a full-wave rectifier bridge 40 of conventional construction having a pair of a.c. input terminals, 42 and 44, and a pair of d.c. output terminal leads, 46 and 48, having the polarity designated in the drawing, the lead 48 serving as the d.c. common or ground for the system. The detector further comprises a filter or pulse shaping circuit formed by series connected resistor 49 and capacitor 50 connected across the d.c. terminal leads 46 and 48 of the bridge 40, and the rectified and shaped voltage pulses across these leads are applied across transistor circuit 52. Transistor circuit 52 includes an NPN transistor 54 having its base connected to the junction of biasing resistors 56 and 58, its emitter connected directly to common lead 48, and its collector connected to the input terminals of the circuit isolating means 32 through a suitable collector resistance 60.

The isolating means 32 in the illustrated embodiment is a so-called solid-state opto-electronic relay employing a light emitting diode 62 as a light source in an enclosed housing with a phototransistor 64. The light produced in response to the collector current of transistor 54 during conduction causes the phototransistor 64 to, in turn, become conductive when suitable bias potentials are applied thereto.

Thus, in the operation of the detector circuit 30, the rectified and shaped voltage applied to the transistor circuit 52 causes the transistor 54 to become conductive during each half-cycle of line voltage except at the zero-voltage crossings, whereat it becomes rather abruptly non-conductive; and hence, the light emitting diode 62 provides a light output which abruptly ceases at each zero-voltage crossing of the a.c. source.

The output signal from the detector circuit 30 is supplied to the amplifier 34 at the collector of the phototransistor 64 which is coupled to the low voltage supply $V_c$ through collector bias resistor 66. The emitter of phototransistor 64 is connected directly to the d.c. common lead 48, as shown. The output signal thus taken at the phototransistor collector on lead 68 drives a cascaded pair of transistors 70 and 72 which are each biased in conventional manner through respective collector resistors 74 and 76, and their respective emitters are connected directly to ground.

Consequently, during most of each half-cycle of source voltage the phototransistor 64 is maintained saturated in a conductive state, and thus shorts the base and emitter of transistor 70, except at the zero-voltage crossings of the a.c. source voltage. Thus, normally, i.e., during most of the half-cycles of the a.c. source, phototransistor 64 is conducting, transistor 70 is non-conducting, and transistor 72 is conducting, with the result that the collector of transistor 72 is substantially at ground and no trigger signal can be supplied to the SCR of the power switching circuit 36. However, during each of the zero-voltage crossings of the a.c. source (e.g., within $\pm$ 4 volts) the phototransistor 64 is cut off and the transistor 70 is forward biased to conduction by voltage $V_c$ through resistor 66. When transistor 70 turns on, this causes transistor 72 to turn off, thereby producing a zero-voltage triggering pulse on the collector of transistor 72 (derived from $V_c$ through resistor 76) which is suitable to trigger the SCR of each power switching circuit 36, 36', etc.

More specifically, the collector of transistor 72 is connected to the gate circuit of SCR 28 and to the gate circuit of 28', as well as to the gate circuits of the SCRs in any number of power switching circuits depending on the number employed in any particular application. Thus, with respect to the amplifier 34, thr trigger pulses are supplied in parallel to each of the SCRs through interconnecting lead 78 and respective input resistors 80, 80', etc. The cathode circuit of each of the SCRs is likewise tied to the d.c. common lead 48 through lead 82. Low d.c. voltage supplies $V_c$, $V'_c$, etc., are applied to the anode of each of the SCR's 28, 28', etc., through respective reed relay coils 26*a*, 26*a'*, etc., connected in series therewith, and control command circuits 16, 16', etc., in the cathode circuit of each of the SCRs thus form means for enabling each of the power switching circuits to operate by completing or closing the anode to cathode circuit of each SCR across the low voltage d.c. supply.

Of course, any type of switching means may be employed for the transistor circuit 16 which is effectively merely a switch closure, but which in the illustrated circuit is advantageous in that it permits operation by typical semiconductor switching devices supply d.c. pulses normally found in various logic circuits. A limiting resistor 84 is connected across the gate and cathode of each of the SCRs, as shown, but this resistor may be internally provided within the SCR package as commercially obtained. The illustrated imput resistors 80 may or may not be employed, depending on the particular requirements of the circuit components, the particular type of amplifier being used as a driver or source of trigger pulses, and the number of power switching circuits included within the system, since they merely provide equalization of the driving pulses.

The normally open, single pole reed switch contacts 26*b*, 26'*b*, etc., associated with each of the reed relays 26, 26', etc., are connected respectively in the latching circuits of the triacs between the gate and anode and in series with limiting resistors 86, 86', etc.

Thus, in operation, a positive d.c. potential is applied to the anode of each of the SCRs and a trigger pulse is supplied to the gate of each of the SCRs concurrently with each zero-voltage crossing of the a.c. source. Then, whenever a respective control circuit 16 closes the cathode circuit of an SCR to the common lead 48, that SCR will become conductive at the next succeeding zero-voltage crossing and will remain conductive because of the d.c. potential applied to the anode and cathode circuit for succeeding cycles of the a.c. source. The anode current flowing through the reed relay coil closes the normally open reed switch contact which latches the triac 18 into conduction. The triac will remain conductive in the usual mode characteristic of this type of device until the control circuit 16 is actuated to open the cathode circuit of the SCR, at which time the reed relay 26 will be de-energized and the reed switch contacts will open so that the triac will become non-conductive or "off" at the next zero crossing of the load current. The operation of each of the other power switching circuits 36', etc., will of course be the same, any number of such circuits being connectable across leads 78 and 82 as previously indicated.

The component parameters and values indicated in the circuit of the drawing are merely exemplary for standard line voltages (e.g., 120 v. runs) and satisfactory operation of the circuit will be achieved by selecting component values in accordance with well known circuit design techniques for operation at any desired voltage. The low d.c. voltages $V_c$ may be selected in accordance with the particular transistors or other semiconductor devices employed in the system and may be supplied from either a common source or separate sources. Likewise, the particular amplifier circuit employed may be selected of any well known design, or in some cases may be eliminated altogether, and the trigger pulses supplied to the SCR or SCRs directly from the circuit isolating means 32. Further, although the isolating means 32 in the illustrated embodiment is depicted as a solid-state opto-electronic relay, it may be a photocell and lamp module or an isolating transformer of conventional type. Likewise, any other type of device for isolating the different voltage levels between the zero detector circuit and the circuit for triggering the SCRs may be employed as an alternative.

Also, the triac gate resistors 86 may be replaced by an inductor in accordance with the teachings of United States Patent Application Ser. No. 173,571, filed Aug. 20, 1971, and now U.S. Pat. No. 3,697,774, of the same inventor. Of course, a series commutation circuit (not shown) of conventional type may be connected in shunt with the triac to minimize the dv/dt across the triac load terminals in accordance with common practice for this purpose.

Although the presently illustrated circuit employs a triac to switch the line voltage to the load, it is understood that a pair of inverse-parallel connected SCRs may be substituted therefor in a well known manner. Also, although the illustrated circuit employs a reed relay for latching and unlatching the triac under the control of an SCR, it is understood that other switching devices may be employed, but it is preferable that any such other switching device provide good isolation and thus may desirably be in the form of electro-optical device, such as a photodiode or phototransistor switch, or the like, used with a light source such as a light emitting diode or a conventional lamp. The simple mechanical action of the reed relay, however, in addition to its positive isolating characteristic is economical and assures no leakage current through the triac gate circuit; thus it is advantageously employed for this purpose as shown in the illustrated embodiment of the drawing.

It is of course further understood that although a preferred embodiment of the present invention has been illustrated and described, various modifications thereof will be apparent to those skilled in the art; and accordingly, the scope of the present invention should be defined only by the appended claims and equivalents thereof.

Various features of the invention are set forth in the following claims.

What is claimed is:

1. A switching circuit for controlling the application of an a.c. source to a load, comprising switching thyristor means having a pair of load terminals and a control terminal and having a bidirectional switching characteristic, means coupled to said load terminals for connecting the a.c. source to the load, control thyristor means having a pair of load terminals and a control terminal, detector means for providing a signal indicative of a zero-voltage crossing of said a.c. course, means for supplying current to the load terminals of said control thyristor means, circuit means coupled to the control terminal of said control thyristor means and responsive to said signal for triggering said control thyristor means for supplying latching current thereto during succeeding cycles of said a.c. source once said control thyristor means becomes conductive, and switching means responsive to said control thyristor means for selectively coupling, and uncoupling, the control terminal of said switching thyristor means to, and from, one of said load terminals thereof in accordance with the state of said control thyristor means, said switching means having a pair of control terminals and a pair of controlled terminals, said pair of control terminals being connected in series circuit relation to the load terminals of said control thyristor means and said pair of controlled terminals being serially connected between the control terminal of said switching thyristor means and said one load terminal thereof.

2. The circuit of claim 1 comprising an additional switching thyristor means, control thyristor means, and means for connecting an a.c. source to a load through the load terminals of said additional switching thyristor means, said circuit means being coupled to the control terminal of said additional control thyristor means and responsive to said signal for triggering the same and supplying latching current thereto during succeeding cycles of the a.c. source once said additional control thyristor means becomes conductive and additional switching means responsive to said additional control thyristor means for selectively coupling, and uncoupling, the control terminal of said additional switching thyristor means to, and from, one of said load terminals thereof in accordance with the state of said additional control thyristor means.

3. The circuit of claim 2 comprising respective control means in series with the load terminals of each of said control thyristor means for selectively enabling each of the same to become conductive in response to said triggering signal.

4. The circuit of claim 1 wherein said switching means comprises a relay being actuable by the current through the load terminals of said control thyristor means and having contacts connected between the control terminal and said one load terminal of said switching thyristor means.

5. The circuit of claim 1 comprising control means in series with the load terminals of said control thyristor means for enabling the same to become conductive in response to said triggering signal.

6. The circuit of claim 1 comprising circuit isolating means connected between said detector means and said circuit means to permit operation of the latter at a low d.c. voltage relative to the voltage of said a.c. source.

7. The circuit of claim 6 wherein said circuit isolating means comprises an opto-electronic relay.

8. A circuit for controlling the application of an a.c. source to a load, comprising:

a. a power switching circuit including a switching thyristor having a pair of load terminals and a control terminal and having a bidirectional switching characteristic, means coupled to said load terminals for connecting the a.c. source to the load, a control thyristor circuit comprising a control thyristor having a pair of load terminals and a control terminal and circuit means for coupling the pair of load terminals of said control thyristor to a source of d.c. voltage, said circuit means including a relay having the electromagnetic coil thereof connected in series circuit relation to said control thyristor load terminals and said d.c. source, and the controlled contacts of said relay connected between the control terminal and one of the load terminals of said switching thyristor, b. a detector circuit comprising a rectifier circuit for providing a d.c. voltage from said a.c. source, and a transistor circuit coupled to said rectifier circuit and including biasing resistances for biasing the transistor to provide an output signal indicative of a zero-voltage crossing of said a.c. source, and c. means responsive to said detector output signal for applying a trigger voltage to the control terminal of said control thyristor at said zero-voltage crossing of the a.c. source, while electrically isolating the d.c. voltage levels of said control thyristor circuit from those of said detector circuit.

9. The circuit of claim 8 wherein said means responsive to said detector output signal includes an amplifier circuit energized by a source of d.c. voltage during operation of said circuit for providing said trigger voltage.

10. The circuit of claim 9 for controlling the application of one or more a.c. sources to a plurality of loads, wherein said circuit comprises a plurality of said power switching circuits and wherein said amplifier circuit is coupled to the control terminal of each control thyristor of the respective power switching circuits to provide said trigger voltage thereto.

11. The circuit of claim 10 comprising control means in series with the load terminals of each control thyristor of the respective power switching circuits for separately enabling the control thyristors to become conductive in response to said trigger voltage.

* * * * *